(12) United States Patent
Nagashima

(10) Patent No.: US 6,756,299 B2
(45) Date of Patent: Jun. 29, 2004

(54) PROCESS FOR FABRICATING A SEMICONDUCTOR DEVICE

(75) Inventor: Naoki Nagashima, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/285,959

(22) Filed: Nov. 1, 2002

(65) Prior Publication Data

US 2003/0124839 A1 Jul. 3, 2003

(30) Foreign Application Priority Data

Nov. 9, 2001 (JP) ......................................... 2001-343940

(51) Int. Cl.$^7$ .......................................... H01L 21/4763
(52) U.S. Cl. ....................................................... 438/637
(58) Field of Search ................................. 438/637, 700

(56) References Cited

U.S. PATENT DOCUMENTS

| | | | | |
|---|---|---|---|---|
| 6,204,168 B1 | * | 3/2001 | Naik et al. .................. | 438/638 |
| 6,218,079 B1 | * | 4/2001 | Shin et al. ................... | 430/314 |
| 6,294,315 B2 | * | 9/2001 | Shin et al. ................... | 430/313 |
| 6,326,301 B1 | * | 12/2001 | Venkatesan et al. ........ | 438/638 |
| 2001/0029105 A1 | * | 10/2001 | Seta et al. ................... | 438/694 |
| 2003/0001267 A1 | * | 1/2003 | Watanabe .................... | 257/758 |
| 2003/0057561 A1 | * | 3/2003 | Fukuyama et al. ......... | 257/774 |

* cited by examiner

Primary Examiner—David Nelms
Assistant Examiner—Thao P. Le
(74) Attorney, Agent, or Firm—Robert J. Depke; Holland & Knight LLP

(57) ABSTRACT

A process for fabricating a semiconductor device, which reduces the number of steps required for forming a via hole and a wiring trench in the insulating film comprised of a low dielectric-constant insulating material, resulting in a lower cost for fabrication and a shorter turn around time, is provided. A photosensitive silazane film is exposed and developed to form a hard mask on an interlayer dielectric. The hard mask defines a wiring pattern for a wiring layer and a position of a via hole. Then, a resist film is formed on the interlayer dielectric to form a resist mask having a via hole pattern, and part of a via hole is formed using the resist mask. The interlayer dielectric is subjected to anisotropic etching using the hard mask to form a wiring trench and to allow the via hole to reach the wiring layer, and the wiring layer is exposed.

4 Claims, 4 Drawing Sheets

US 6,756,299 B2

PROCESS FOR FABRICATING A SEMICONDUCTOR DEVICE

CROSS REFERENCES TO RELATED APPLICATIONS

The present document is based on Japanese Priority Document JP 2001-343940, filed in the Japanese Patent Office on Nov. 9, 2001, the entire contents of which being incorporated herein by reference.

BACKGROUND OF THE INVENTION

1. Field of the Invention

The present invention relates to a process for fabricating a semiconductor device. More particularly, the present invention is concerned with a process for fabricating a semiconductor device having a multilayer wiring structure comprised of copper or the like as a material for wiring, which process enables reduction in both the number of steps and the wiring capacitance. In the present invention, the term "via hole" is a collective term for a contact hole, a via hole, and a through hole.

2. Description of Related Art

Recently, as a semiconductor device is scaled down and has an increased integration degree, the wiring in the semiconductor device is shrunk, causing reduction in the wiring pitch. Therefore, when a semiconductor device is produced by a process in which a wiring layer is formed on an insulating film and then patterned to form a wiring, the semiconductor device produced is likely to suffer wiring failure, such as burnout or short-circuiting.

For solving the problem, as a substitute for the process in which a wiring is formed on an insulating film, a so-called damascene process, in which a buried metal wiring is formed in an insulating film, has been practically used. Further, a dual damascene process comprising formation of an interconnection plug and formation of a wiring by a damascene process has also been practically used.

By the way, in accordance with further reduction in the wiring pitch, the wiring capacitance is increasing, and hence, it has been strongly desired to develop materials for wiring having a lowered electrical resistance and insulating films having a lowered dielectric constant. Therefore, it is attempted to use copper (Cu) as a substitute for aluminum (Al) which has been used as a material for wiring or to use insulating materials, such as organic materials including fluororesins, and xerogel, as a substitute for silicon oxide ($SiO_2$) which has been used as an insulating film between wiring layers or between wirings. Organic materials including fluororesins, and xerogel are known as a low dielectric-constant insulating material having a dielectric constant as low as 3.0 or less.

An etching technique for copper has not yet been established, and therefore, the above-mentioned dual damascene process is inevitably used for utilizing copper as a material for wiring without any problem.

However, organic low dielectric-constant insulating materials have similar etching properties to those of a resist mask, especially they have almost the same etching rate as that of a resist mask, and hence, when copper is used as a material for wiring and a low dielectric-constant insulating material is used as an insulating film in the dual damascene process, it is difficult to use a resist as a mask for the low dielectric-constant insulating material. For this reason, when both copper and a low dielectric-constant insulating material are used in the dual damascene process, for obtaining a via hole and a wiring trench in communication with the via hole, a process is needed in which a wiring pattern is formed using a resist by a photolithography technique and the wiring pattern is transferred to an inorganic material film to form a so-called hard mask, and then a low dielectric-constant insulating material is etched using the hard mask.

Now, a process for forming a wiring for MOS transistor by a conventional dual damascene process is described below with reference to FIGS. 3 and 4. FIGS. 3A to 3D and FIGS. 4A to E are diagrammatic cross-sectional views showing the successive steps in the formation of wiring by a conventional dual damascene process.

First, as shown in FIG. 3A, an interlayer dielectric 10 is formed from, for example, an organic insulating film on a substrate (not shown), and a wiring trench 12 is then formed in the interlayer dielectric 10. Then, as a barrier metal, tantalum (Ta) is deposited on an inner wall of the wiring trench 12 so that the resultant thickness becomes 30 nm to form a refractory metal film 14, and then a groove surrounded by the refractory metal film 14 is filled with a Cu wiring material 16.

Subsequently, the Cu wiring material 16 is subjected to chemical mechanical polishing (hereinafter, frequently referred to simply as "CMP") treatment to form a wiring layer (lower wiring) 16, and then, on the interlayer dielectric 10 containing the wiring layer 16, an insulating protecting film 18, an interlayer dielectric 20, and an interlayer dielectric 22 are formed in this order.

The protecting film 18, the interlayer dielectric 20, and the interlayer dielectric 22 can be formed, respectively, from SiN having a thickness of 50 nm, an organic low dielectric-constant insulating material having a thickness of 700 nm, and $SiO_2$ having a thickness of 200 nm.

Then, a photoresist 24 is applied onto the interlayer dielectric 22, and then the photoresist 24 is exposed and developed to form a resist mask 24 having a wiring pattern for an upper wiring as shown in FIG. 3B. Subsequently, the interlayer dielectric 22 is subjected to anisotropic etching using the resist mask 24 to transfer the wiring pattern for an upper wiring to the interlayer dielectric 22 as shown in FIG. 3C.

Then, as shown in FIG. 3D, the resist mask 24 is removed to obtain an etching mask 22A having the wiring pattern for an upper wiring. Then, as shown in FIG. 4A, a photoresist 26 is deposited onto the interlayer dielectric 20 having thereon the etching mask 22A to form a resist mask 26A having a via hole pattern 28 for the wiring layer 16 using a photolithography technique.

Next, as shown in FIG. 4B, part of the etching mask 22A which protrudes in the via hole pattern 28 and the interlayer dielectric 20 are subjected to anisotropic etching using the resist mask 26A. At a point in time when the thickness of the interlayer dielectric 20 on the protecting film 18 becomes, for example, 200 nm, the anisotropic etching is terminated to form part of a via hole 30. Then, as shown in FIG. 4C, the resist mask 26A is removed. Then, as shown in FIG. 4D, the interlayer dielectric 20 is subjected to anisotropic etching using the etching mask 22A to form a wiring trench 32 in communication with the via hole 30 and the interlayer dielectric 20 is further etched through the via hole 30 so that the via hole 30 reaches the surface of the wiring layer 16.

Then, as shown in FIG. 4E, Ta is deposited on the inner wall of each of the via hole 30 and the wiring trench 32 so that the resultant thickness becomes 30 nm to form a refractory metal film 34, and then the groove surrounded by the refractory metal film 34 is filled with a Cu wiring material 36. Then, the Cu wiring material 36 is subjected to CMP treatment to remove the excess Cu and excess refractory metal film 34 by polishing, thus forming a wiring layer 36A and an interconnection plug 38 in the via hole 30 simultaneously. Subsequently, a sequence of the above-described dual damascene process is repeated in a desired frequency to obtain a MOS transistor having a dual damascene structure multilayer wiring.

For obtaining the etching mask 22A by the above-described conventional dual damascene process, a plurality of steps, for example, (1) a step of forming the interlayer dielectric 22, (2) a step of depositing the photoresist 24, (3) a step of forming the resist mask 24, (4) a step of transferring a wiring pattern to the interlayer dielectric 22, and (5) a step of removing the resist mask 24 are required.

Therefore, the fabrication process needs a large number of steps, so that the process becomes complicated, leading to problems in that the cost for producing LSI having a MOS transistor is increased, and an increased turn around time (hereinafter, frequently referred to simply as "TAT") causes a delay in the delivery time.

SUMMARY OF THE INVENTION

The present invention has been made with a view toward solving the above-mentioned problems, and it is a task to provide a process for fabricating a semiconductor device using a low dielectric-constant insulating material in the insulating film between wiring layers or between wirings, which process is advantageous in that the number of steps required for forming a via hole and a wiring trench in the insulating film comprised of a low dielectric-constant insulating material can be reduced, thus making it possible to lower the cost for fabrication and to shorten the TAT.

For achieving the above-mentioned task, the process for fabricating a semiconductor device of the present invention comprises: a first step of forming, on a lower wiring, an interlayer dielectric comprised of a low dielectric-constant insulating material, and a photosensitive insulating film in this order; a second step of exposing and developing the photosensitive insulating film to form a hard mask comprised of the photosensitive insulating film on the interlayer dielectric, wherein the hard mask defines a wiring pattern for an upper wiring and a position of a via hole for the lower wiring; a third step of depositing a resist film onto the interlayer dielectric having thereon the hard mask to form a resist mask having a via hole pattern for the lower wiring using a photolithography technique; a fourth step of subjecting part of the interlayer dielectric to anisotropic etching using the resist mask to form part of a via hole; and a fifth step of removing the resist mask, and then subjecting the interlayer dielectric to anisotropic etching using the hard mask to form a wiring trench for the upper wiring above the via hole so as to be in communication with the via hole and to allow the via hole to reach the lower wiring so that the lower wiring is exposed.

In the process for fabricating a semiconductor device of the present invention, there is not needed a step in which on an interlayer dielectric comprised of a low dielectric-constant insulating material is formed another interlayer dielectric, and a wiring pattern formed in a resist mask by a photolithography technique is transferred to the another interlayer dielectric wherein the step has conventionally been required for the process. Therefore, the number of steps required for forming a via hole and a wiring trench in the interlayer dielectric comprised of a low dielectric-constant insulating material can be reduced to simplify the process, thus making it possible to lower the cost for fabrication and to shorten the TAT.

In one preferred process for fabricating a semiconductor device in the present invention, in the first step, SiLK (registered trademark) which is a non-fluorine organic polymer, manufactured and sold by Dow Chemical Company, can be used as the low dielectric-constant insulating material. On the other hand, a photosensitive silazane can be used as the photosensitive insulating film.

The term "photosensitive silazane" used in the present invention means methylsilazane (MSZ) containing a photo acid generating agent and a sensitizer and having positive photosensitivity. When a photosensitive insulating film formed from the photosensitive silazane is exposed to electron beam or ultraviolet light irradiation, a photo acid ($H^+$) is generated in the film to cleave an Si—N linkage constituting MSZ, so that the resultant film absorbs $H_2O$. Then, the film is developed using a tetramethylammonium hydroxide (TMAH) solution to etch out the exposed portion of the film.

Subsequently, the resultant film is subjected to heat treatment in an $N_2$ atmosphere at 400° C. to convert the photosensitive silazane to methylsilsesquiaxane (hereinafter, frequently referred to simply as "MSQ"). That is, by converting the photosensitive silazane to MSQ having no photodegradability by a heat treatment, the MSQ can be used as a stopper layer for etching (see Nikkei Microdevices 2001 February Issue).

Further, in the present invention, another preferred process for fabricating a semiconductor device further comprises, after the fifth step, a sixth step of filling both the via hole and the wiring trench with a material for wiring, and then subjecting the resultant surface to chemical mechanical polishing (CMP) to form a dual damascene structure having the upper wiring which is electrically connected to the lower wiring through an interconnection plug formed in the via hole.

For preventing the semiconductor device from changing in electrical properties, it is desired that the photosensitive insulating film between wirings on the interlayer dielectric is not completely removed by a CMP treatment but remains. In this case, when the remaining photosensitive insulating film is comprised of a photosensitive silazane, the photosensitive silazane is converted to MSQ having a lower dielectric constant by the above-mentioned heat treatment, thus further increasing the effect of lowering the wiring capacitance.

BRIEF DESCRIPTION OF THE DRAWINGS

The above and other objects, features and advantages of the present invention will become more apparent from the following description of the presently preferred exemplary embodiments of the invention taken in conjunction with the accompanying drawings, in which.

DESCRIPTION OF THE PREFERRED EMBODIMENT

Hereinbelow, a preferred embodiment of the present invention will be described in detail with reference to the accompanying drawings.

Embodiment of Fabrication Process

The present embodiment is one form of an embodiment of a process for fabricating a semiconductor device of the present invention, and FIGS. 1A to 1D and FIGS. 2A to 2D are diagrammatic cross-sectional views showing successive steps in the process of the present embodiment for fabricating a MOS transistor (semiconductor device) having a dual damascene structure.

Figure 1A:
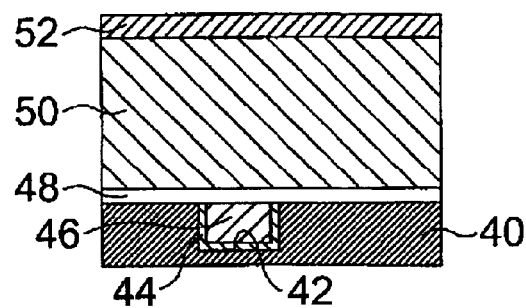
FIGS. 1A to 1D are diagrammatic cross-sectional views showing successive steps in a process for fabricating a semiconductor device according to one embodiment of the present invention.

First, as shown in FIG. 1A, an interlayer dielectric 40 is formed from, for example, an organic insulating film on a substrate (not shown), and a wiring trench 42 is then formed in the interlayer dielectric 40. Then, as a barrier metal, tantalum (Ta) is deposited on the inner wall of the wiring trench 42 so that the resultant thickness becomes 30 nm to form a refractory metal film 44, and then a groove surrounded by the refractory metal film 44 is filled with a Cu wiring material 46 by a physical vapor deposition (PVD) process or an electroplating process.

The refractory metal film 44 is formed for improving the adhesion of Cu and preventing Cu from being diffused to the interlayer dielectric, and hence the material for the refractory metal film 44 is not limited to Ta as long as the same effects are obtained. In addition, the Cu wiring material 46 is formed for realizing a low resistivity wiring, and therefore a metal other than Cu can be used as long as the same effect is obtained.

Subsequently, the Cu wiring material 46 is subjected to CMP treatment to remove the excess Cu and excess Ta, that is, it is subjected to single damascene process to form a wiring layer (lower wiring) 46. Then, on the interlayer dielectric 40 containing the wiring layer 46, an insulating protecting film 48 and an interlayer dielectric 50 are formed in this order.

The protecting film 48 is formed by depositing 50 nm-thick SiN to prevent Cu contained in the wiring layer 46 from being diffused to the interlayer dielectric 50, and the material for the protecting film 48 is not limited to SiN as long as the resultant film functions similarly.

The interlayer dielectric 50 has a thickness of 700 nm, and is comprised of an organic low dielectric-constant insulating material. As the low dielectric-constant insulating material, a non-fluorine organic polymer, for example, SiLK (registered trademark), manufactured and sold by Dow Chemical Company, can be used.

The thickness of the interlayer dielectric 50 is adjusted to be the same as the sum of the height of a via hole 60 and the height of a wiring trench 62 so that the interlayer dielectric 50 advantageously functions as an insulating film between wirings or an interlayer dielectric later (see FIG. 2C).

Figure 1B:
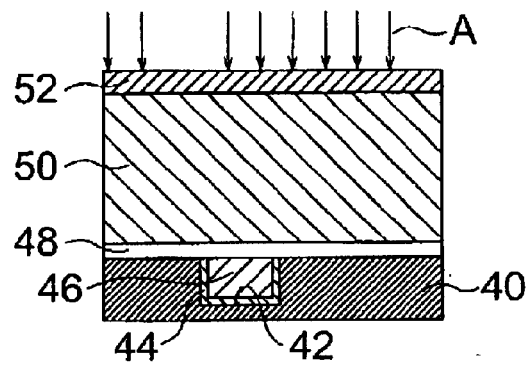

Next, a photosensitive silazane film (photosensitive insulating film) 52 is formed on the interlayer dielectric 50. Then, as shown in FIG. 1B, the photosensitive silazane film 52 is exposed to a light or an electron beam indicated by arrows A, and then subjected to development treatment using a tetramethylammonium hydroxide (TMAH) solution to remove the exposed portion of the photosensitive silazane film 52.

Figure 1C:
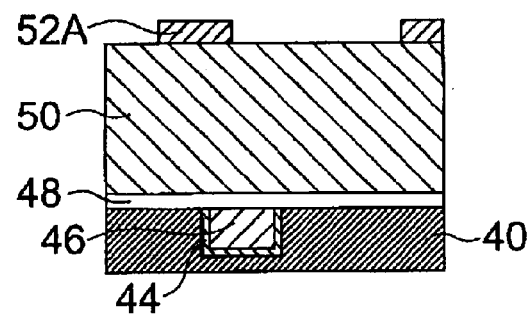

Thus, as shown in FIG. 1C, a hard mask 52A comprised of the photosensitive silazane film is formed on the interlayer dielectric 50 wherein the hard mask 52A defines a wiring pattern for an upper wiring and a position of a via hole for the wiring layer 46. Subsequently, the hard mask 52A is subjected to heat treatment in an $N_2$ atmosphere at 400° C. to convert the photosensitive silazane constituting the hard mask 52A to MSQ. This conversion enables the hard mask 52A to have a lowered dielectric constant.

Figure 1D:
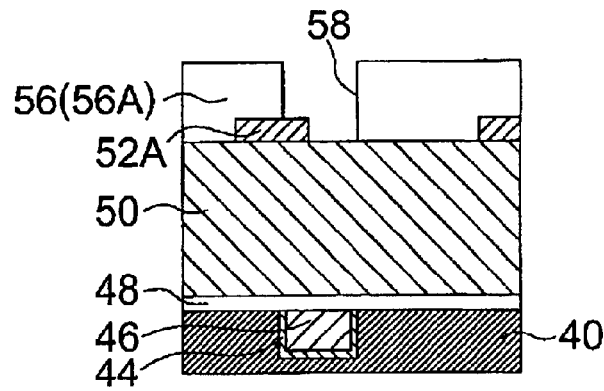
Figure 2A:
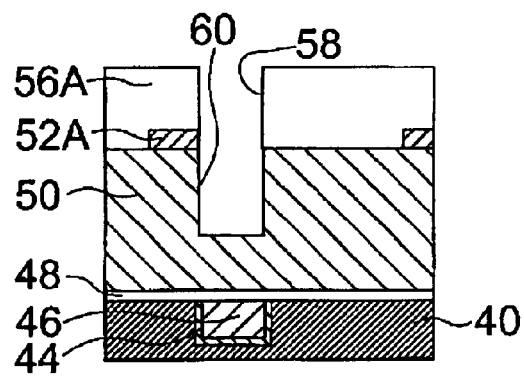
FIGS. 2A to 2D are diagrammatic cross-sectional views showing successive steps in the process for fabricating a semiconductor device according to the one embodiment of the present invention.

Then, as shown in FIG. 1D, a photoresist film 56 is deposited onto the interlayer dielectric 50 having thereon the hard mask 52A to form a resist mask 56A having a via hole pattern 58 for the wiring layer 46 by a photolithography technique. Subsequently, as shown in FIG. 2A, part of the photosensitive silazane film 52 converted to MSQ, which part protrudes in a via hole 60, and the interlayer dielectric 50 are subjected to anisotropic etching using the resist mask 56A. In this anisotropic etching process, part of the interlayer dielectric 50 is etched so that 200 nm of the interlayer dielectric 50 remains on the protecting film 48 to form part of the via hole 60.

Figure 2B:
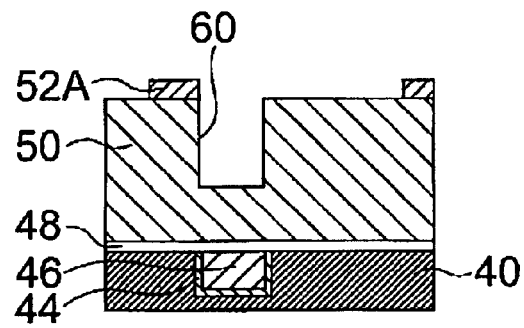
Figure 2C:
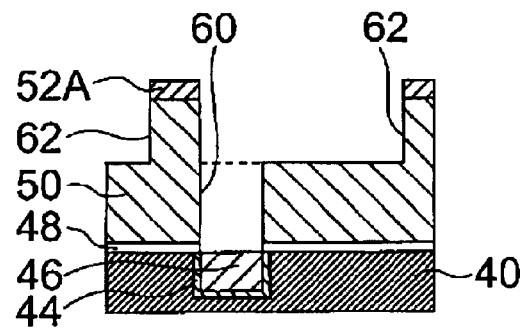

In this case, the etching depth for the interlayer dielectric 50 is not necessarily so large that the via hole 60 reaches around the upper portion of the protecting film 48, but the interlayer dielectric 50 may be etched in such a depth that the bottom of the via hole 60 reaches the wiring layer 46 in the below-described etching step for a wiring trench 62 (FIG. 2C).

Next, as shown in FIG. 2B, a resist mask 56A is removed by peeling off. Then, as shown in FIG. 2C, the interlayer dielectric 50 is subjected to anisotropic etching using the hard mask 52A to form a wiring trench 62 for an upper wiring above the via hole 60 so as to be in communication with the via hole 60, and the interlayer dielectric 50 is further etched through the via hole 60 to remove the interlayer dielectric 50 and the protecting film 48, allowing the via hole 60 to reach the wiring layer 46 so that the wiring layer 46 is exposed.

In the anisotropic etching step, the etching time is controlled to obtain a desired height of the wiring trench 62. In addition, the hard mask 52A is optionally removed by etching.

Figure 2D:
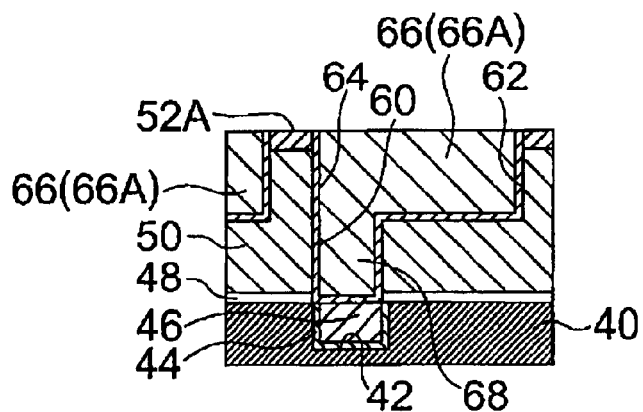
Figure 3A:
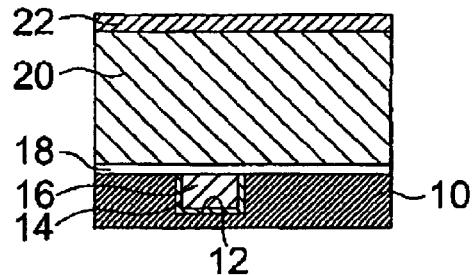
FIGS. 3A to 3D are diagrammatic cross-sectional views showing successive steps in a conventional process for fabricating a semiconductor device.
Figure 3B:
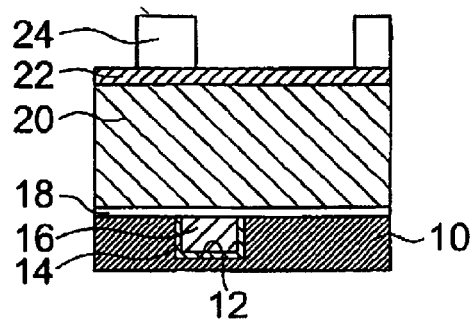
Figure 3C:
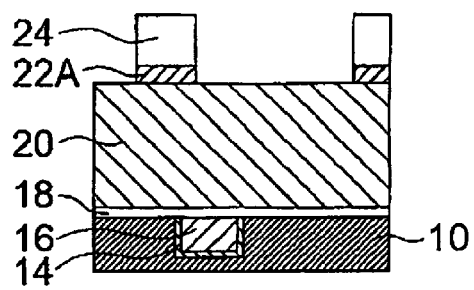
Figure 3D:
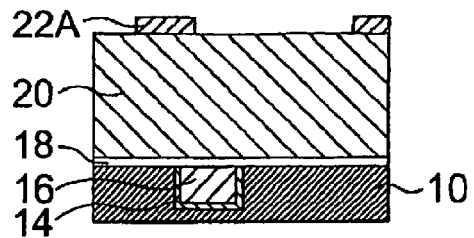
Figure 4A:
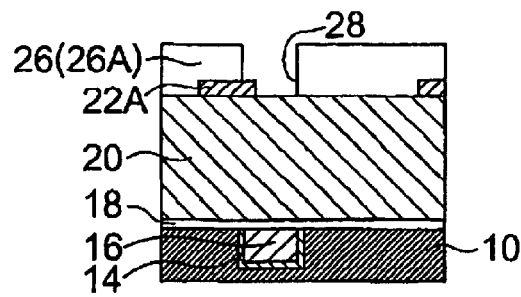
FIGS. 4A to 4E are diagrammatic cross-sectional views showing successive steps in the conventional process for fabricating a semiconductor device.
Figure 4B:
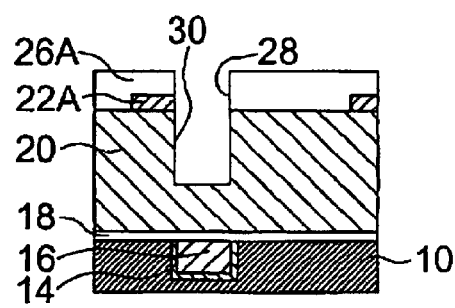
Figure 4C:
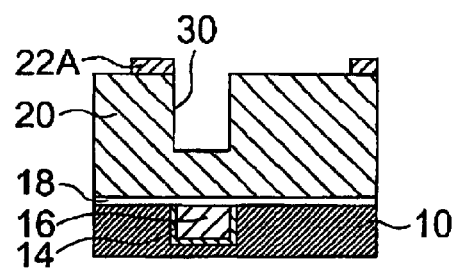
Figure 4D:
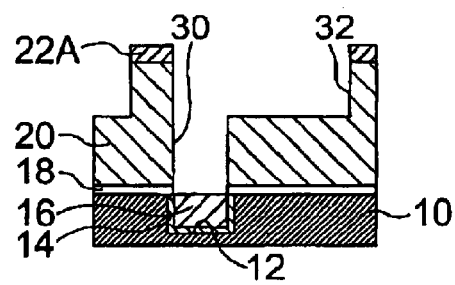
Figure 4E:
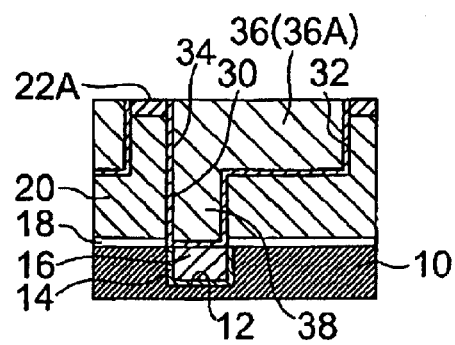

Subsequently, as shown in FIG. 2D, as a barrier metal, Ta is deposited on the inner wall of each of the via hole 60 and the wiring trench 62 so that the resultant thickness becomes 30 nm to form a refractory metal film 64, and then the groove surrounded by the refractory metal film 64 is filled with a Cu wiring material 66.

Then, the Cu wiring material 66 is subjected to CMP treatment to remove the excess Cu and excess refractory metal film 64 by polishing, forming a wiring layer 66A and an interconnection plug 68 in the via hole 60 simultaneously. Thus, a dual damascene structure having the wiring layer 66A electrically connected to the wiring layer 46 through the interconnection plug 68 is formed. Subsequently, a sequence of the above-described dual damascene process is repeated in a desired frequency to obtain a MOS transistor having a dual damascene structure multilayer wiring.

As described above, in the present embodiment, the photosensitive silazane film 52 is patterned to form the hard mask 52A, and then both the via hole 60 and the wiring trench 62 are formed simultaneously, thus simplifying the dual damascene process.

Specifically, steps required for obtaining the etching mask 22A by the conventional technique shown in FIGS. 3 and 4, for example, (1) a step of forming the interlayer dielectric 22, (2) a step of depositing the photoresist 24, (3) a step of forming the resist mask 24, (4) a step of transferring a wiring pattern to the interlayer dielectric 22, and (5) a step of removing the resist mask 24 are not needed in the present embodiment. Therefore, in the present embodiment, not only can the cost for fabrication be lowered, but also the TAT can be shortened. Further, it is possible to avoid an occurrence of failure caused by a mismatch between the position of the interconnection plug 68 and that of the wiring layer 66.

In the present embodiment, as shown in FIG. 1C, after patterning the photosensitive silazane film 52, the patterned photosensitive silazane film 52 is converted to MSQ, but the timing of conversion of the photosensitive silazane film to MSQ is not limited to this.

Further, in the present embodiment, a wiring and a via hole are formed individually using a photolithography technique, but the technique used for forming a wiring and a via hole is not limited to photolithography, and, when using an electron beam or X-ray, the same effect can be obtained.

What is claimed is:

1. A process for fabricating a semiconductor device, said process comprising:

forming, above a lower wiring, an interlayer dielectric comprised of a low dielectric-constant insulating material, forming on said interlayer dielectric, a photosensitive insulating film;

exposing and developing said photosensitive insulating film to form a hard mask comprised of said photosensitive insulating film on said interlayer dielectric, wherein said hard mask defines a wiring pattern for an upper wiring and a position of a via hole for said lower wiring;

depositing a resist film above said interlayer dielectric having thereon said hard mask to form a resist mask having a via hole pattern for said lower wiring using a photolithography technique;

subjecting part of said interlayer dielectric to anisotropic etching using said resist mask to form part of a via hole; and removing said resist mask, and then subjecting said interlayer dielectric to anisotropic etching using said hard mask to allow said via hole to reach said lower wiring so that said lower wiring is exposed, and to form a wiring trench for said upper wiring above said via hole so as to be in communication with said via hole.

2. The process according to claim 1, wherein, non-fluorine organic polymer is used as said low dielectric-constant insulating material, and a photosensitive silazane is used as said photosensitive insulating film.

3. The process according to claim 1, further comprising, filling both said via hole and said wiring trench with a material for wiring, and then subjecting the resultant surface to chemical mechanical polishing (CMP) to form a dual damascene structure having said upper wiring which is electrically connected to said lower wiring through an interconnection plug formed in said via hole.

4. The process according to claim 2, further comprising, filling both said via hole and said wiring trench with a material for wiring, and then subjecting the resultant surface to chemical mechanical polishing (CMP) to form a dual damascene structure having said upper wiring which is electrically connected to said lower wiring through an interconnection plug formed in said via hole.

* * * * *